United States Patent [19]

Olsen

[11] Patent Number: 4,647,836
[45] Date of Patent: Mar. 3, 1987

[54] PYROELECTRIC ENERGY CONVERTER AND METHOD

[76] Inventor: Randall B. Olsen, 3025 Via de Caballo, Olivenhain, Calif. 92024

[21] Appl. No.: 585,426

[22] Filed: Mar. 2, 1984

[51] Int. Cl.$^4$ .......................... H02N 1/00; H02N 3/00
[52] U.S. Cl. ..................................... 322/2 A; 310/308
[58] Field of Search .............. 322/2 A, 2 R; 310/306, 310/308; 136/254; 250/211 R

[56] References Cited

U.S. PATENT DOCUMENTS

| 3,243,687 | 3/1966 | Holt | 322/2 R |
| 4,096,393 | 6/1978 | Sher | 322/2 A X |
| 4,220,906 | 9/1980 | Drummond | 322/2 A |
| 4,425,540 | 1/1984 | Olsen | 322/2 A |

Primary Examiner—R. J. Hickey

[57] ABSTRACT

Apparatus and method for converting heat to electrical energy by the use of one or more capacitors having temperature dependent capacitance are disclosed. The capacitor is cycled between relatively high and relatively low temperatures. Upon heating of the capacitor, the capacitance thereof is reduced, so that a charge therein is caused to expand into associated efficient external circuitry in which it is available to do electrical work. The capacitor is then cooled and recharged and the cycle is repeated. The electrical output of the capacitor results from the regenerative delivery of heat to and removal of heat from the capacitor, and efficient conversion of heat to electric energy is thereby effected.

38 Claims, 17 Drawing Figures

PYROELECTRIC ENERGY CONVERTER AND METHOD

BACKGROUND OF THE INVENTION

This invention relates to improvements in pyroelectric power conversion and more particularly to the conversion of heat to electrical energy by the use of one or more capacitors having temperature dependent capacitance and novel means for charging the capacitor during the cool portion of its thermal cycle so that upon subsequent heating and concomitant decrease in the dielectric constant of the capacitor, the charge therein is caused to expand into associated circuitry in which it is available to do electrical work.

DESCRIPTION OF THE PRIOR ART

The use of thermally cycled capacitors in energy conversion 10 is attractive because the working substance is a solid, rather than a gas or vapor, and because of its very high density it requires little volume to handle large power flows. Moreover, with operation at relatively low working temperatures, e.g., 350 C., and at pressures approximating atmospheric, the cost factors are significantly lower than for other forms of power conversion apparatus. While the concept of deriving electrical energy by thermally cycling temperature dependent capacitors has been known, the costs associated with the rejection of exhaust heat, have apparently precluded their use in practical application for the production of electrical energy in some environments (e.g. outer space).

Representative of the prior art is Drummond U.S. Pat. No. 4,220,906. This patent discloses the conversion of heat to electrical energy by the use of stacked capacitors having temperature dependent capacitance and the use of reeds which serve as thermal switches and are caused to vibrate by the flow of vapor carrying heat between stages, thereby pulsing the heat at the proper frequency and phase through the stacked capacitors. Skinner U.S. Pat. No. 3,610,970 exploits a somewhat different concept in an energy conversion system in which a first material within the region between the electrodes of a capacitor is replaced, following charging of the capacitor, by second material having a lower dielectric constant than the first material. The capacitor is then discharged and the first material restored to the region between the capacitor electrodes for subsequent recharging. Olsen U.S. Pat. No. 4,425,540 covers one method for the regenerative delivery of heat to and removal of heat from capacitors having temperature dependent capacitance thereby achieving an improved efficiency of conversion of heat energy into electrical energy.

SUMMARY OF THE INVENTION

The present invention provides apparatus and a method for converting heat to electrical energy by the use of one or more capacitors having temperature dependent capacitance. The capacitor is cycled between relatively high and relatively low temperatures, for example, by a periodic exposure to radiative heat source. Upon heating of the charged capacitor, the capacitance thereof is reduced, so that the charge therein is caused to expand into associated external circuitry in which it is available to do electrical work. The capacitor is then cooled (e.g. by reradiation of its heat) and recharged, and the cycle repeated. The capacitor may take the form of a large area thin sheet. The large surface area per unit mass provides for the effective heat transfer of radiant energy.

Another object of the present invention is to provide for an efficient means of delivering electrical charge to and extracting electrical charge from temperature dependent capacitors.

Another object of the present invention is to provide for environmental protection for large area capacitor sheets so as to increase the useable lifetime of the converter.

A further object of the present invention is to provide a new means for efficient handling of heat flow in a pyroelectric converter.

Bands of pyroelectric material are formed into closed loops which are supported at the ends by pulleys.

Figure 17:
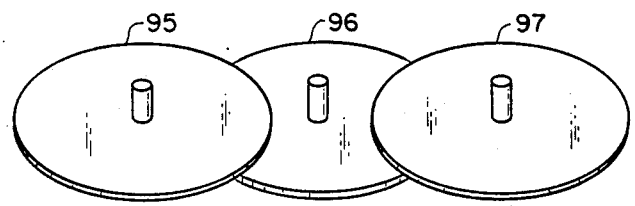

FIG. 17 illustrates another method for achieving regenerative heat flow in an extended pyroelectric converter. Disks of pyroelectric material are spun in an overlapping arrangement to as to promote the transfer of heat from one disk to the next.

DETAILED DESCRIPTION OF THE INVENTION

Broadly stated, the present invention is directed to apparatus and a method for converting heat to electrical energy by using heat energy to move an electrical charge without passing the energy through an intermediate mechanical form. The present invention utilizes one or more capacitors in which the dielectric material has temperature dependent capacitance. This causes charge to be alternately expelled from and attracted to it, doing electrical work as the capacitor is thermally cycled. Particularly useful as such dielectric material are ferroelectric materials comprising copolymers of poly(vinylidene fluoride-trifluoroethylene), such materials being hereinafter referred to as PVDF-TrFE materials and ferroelectric materials comprising lead zirconate, lead titanate, and lead stannate, such materials being hereinafter referred to as PZST materials. For the purposes of brevity the term capacitor is used herein to denote a capacitor-like element. However, the capacitor-like element is unlike a normal capacitor. In the present invention, a given amount of electrical energy is stored in the capacitor-like element and later, due to the pyroelectric conversion of heat into electrical energy, an amount of electrical energy which is greater than said given amount of electrical energy is removed from the capacitor-like element.

Prior to discussing the detailed operation and structure of the apparatus and method of the present invention, it should be understood that, while a single capacitor having temperature dependent capacitance, can be driven through a thermal cycle to produce a given amount of electricity, the usefulness of the invention from a practical standpoint resides in producing significant quantities of electrical energy that result from effectively combining a large number of such capacitors in a lightweight relatively low cost structure.

Figure 1:
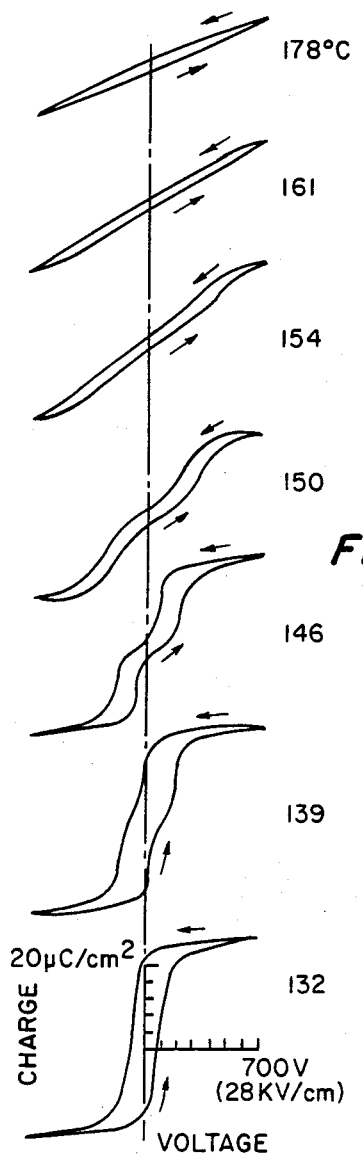
FIG. 1 is a graphic illustration showing a family of hysteresis curves illustrating the isothermal charge-voltage behavior of a ferroelectric material at various temperatures.

The electrical energy production cycle of a capacitor in the apparatus of the present invention may be described in terms of the charge-voltage (hysteresis) behavior of a capacitor incorporating ferroelectric dielectric material, such as PZST material. Referring to FIG. 1 of the drawings, the hysteresis loops therein illustrate the isothermal charge-voltage behavior at various temperatures for capacitors utilizing the ferroelectric material $Pb_{0.99}Nb_{0.02}(Zr_{0.68}, Sn_{0.25}, Ti_{0.07})_{0.98}O_3$ The specimen of FIG. 1 is 0.025 cm thick and was made by standard sintering methods. (It is also possible to employ thin film techniques, for example sputtering to achieve higher performance capacitors.) For any cyclic process, the area on a charge-voltage diagram represents electrical work, since $W=\int V dq$, where W represents electrical work, V represents voltage, and q represents charge. For example, every time that voltage is applied to a capacitor utilizing ferroelectric material maintained at a given temperature, an amount of electrical energy equal to the hysteresis loop area is dissipated as heat. In this case the loop is cycled in a counter-clockwise sense, as indicated by the arrows in FIG. 1.

The present invention exploits the concept that, by removing the isothermal constraint, it is possible to reverse the direction in which the loop is cycled, i.e., to cause it to be cycled clockwise. This results in the production of electrical energy from heat. The family of hysteresis loops in FIG. 1 dramatically illustrates the remarkable temperature dependence of the charge voltage loop of a capacitor comprising ferroelectric dielectric material. Because of this temperature dependence, it is possible, by controlling temperature as well applied voltage, to constrain a ferroelectric capacitor to execute an electrical energy-producing clockwise loop.

Figure 2:
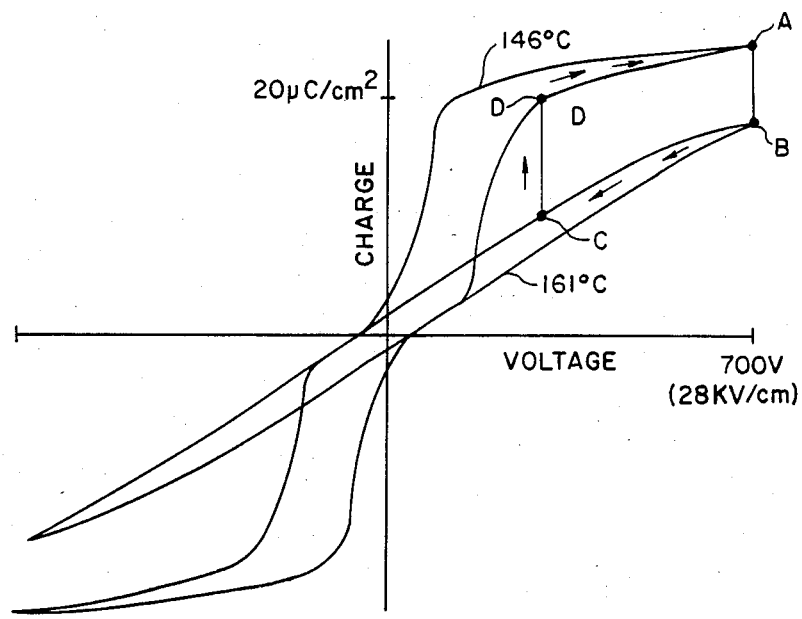
FIG. 2 shows on a larger scale two of the hysteresis curves of FIG. 1 superimposed upon one another and graphically illustrates the operation of the invention.

FIG. 2 shows the charge-voltage characteristics, i.e., the hysteresis loops characteristic of the aforementioned PZST material at 146 C. and at 161 C. The production of electrical energy by thermally cycling a PZST capacitor around a clockwise loop between these two temperatures will now be described.

Starting a point A with the capacitor at the lower temperature (146 C.) and substantially fully charged at high voltage, for example 700 volts and an electric field of 28 kv/cm, heating of the capacitor to the higher temperature (161 C.) at point B causes it to be partially discharged, for example into associated electrical circuitry including a high voltage source. After reaching the higher temperature, a reduction of the voltage of the external source, for example to 120 volts, permits the capacitor to substantially fully discharge into that source by the time point C is reached, the capacitor voltage having by this time dropped to a low value. At point C the capacitor is allowed to cool from the higher to the lower temperature, during which time it is partially recharged from the low voltage external source by the time it reaches point D. An increase in the voltage of the external voltage source at point D increases the voltage supplied to the capacitor and fully recharges the latter to its original voltage and charge at the low temperature as point A is reached. This completes a clockwise cycle which is opposite to the counter-clockwise isothermal hysteretic loop direction, and the amount of electrical energy produced by one thermal cycle of the capacitor is represented by the area ABCD of FIG. 2.

The improvement that the copolymer PVDF-TrFE represents over previously existing materials for utilization in pyroelectric energy converters include (a) flexibility, (b) low cost of raw materials, (c) ease of manufacture in large area sheet form and (d) a low temperature Curie point, 70C, which allows low temperature pyroelectric energy conversion. In addition, the dielectric strength of the copolymer is at least 500 kV/cm which is roughly ten times greater than that of lead zirconate ceramic pyroelectric materials described in U.S. Pat. No. 4,425,540.

An important consideration for many power sources is the amount of power generated per unit mass of the source. This consideration is especially vital for power sources which are to be used in outer space. An aspect of the present invention is that it provides a very lightweight means of generating electrical power, for example from input sunlight. The lightweight aspect of the present invention is possible because the pyroelectric generator utlizes thin sheets of pyroelectric capacitors. Two examples of extended structures for pyroelectric conversion are FIGS. 3 and 4. In its simplest version a pyroelectic converter can take the form of a rotating cylinder of the prior art of FIG. 3. A given segment 1 of the cylinder will alternately rotate into and out of the direct sunlight. As a result, the temperature of the segment will rise during the lighted time and fall, due to reradiation, each revolution.

Figure 4:
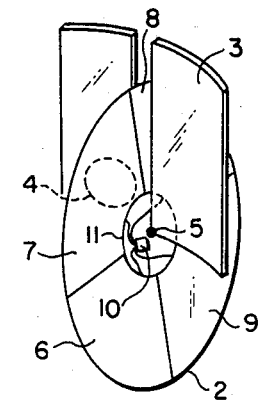
FIG. 4 is a perspective view of a form of the invention which includes solar collectors that focus light onto a portion of a rotating disk of pyroelectric capacitors.

The second example of an extended structure illustrated in FIG. 4 is comprised of a rotating disk 2 of pyroelectric capacitors and a concentrating collector 3 of sunlight. The concentrating collector focuses the incident sunlight upon a small region 4 of the disk. The disk rotates about the axis 5. This collector plus disk structure is hereinafter called the CD structure. For optimum efficiency in the transfer of power from a pyroelectric generator to a useable power output bus, there are several separate pyroelectric generator segments. The disk 2 is therefore comprised of pyroelectric capacitor segments 6,7,8, and 9. The capacitor segments are connected to an external voltage source circuit 10. The external voltage source circuit 10 efficiently serves for both discharging, i.e. power extraction, and recharging of the capacitor segments. The external voltage source circuit 10 sits upon a radiative heat sink 11 which is necessary to dispose of heat caused by the small inefficiencies of the external circuit.

The key aspect of the external voltage source circuit is that it is a reversible variable voltage source. By reversible it is meant that the source can deliver charge at very high efficiency. The voltage source is also continuously variable so that it can perform the operations of capacitor charge up, portion D to A of FIG. 2, and capacitor discharge, portion B to C of FIG. 2, which occur at approximately the lowest and highest temperature respectively, of the cycle. An example of a reversible variable voltage source is essentially a variable version of a switched-mode power supply. The high efficiency of such power supplies is well-known. For the purposes of the present invention, switched-mode power conversion is an efficient way to transform electrical energy at one voltage into electrical energy at a different voltage.

Figure 5:
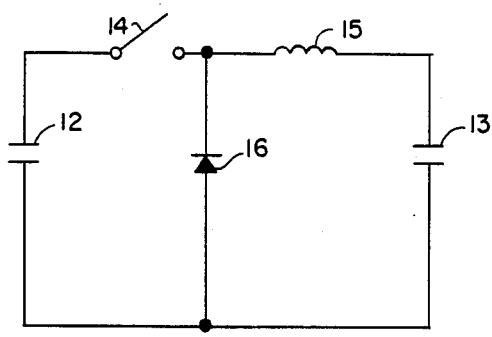
FIG. 5 is a schematic showing a simplified version of a switched-mode power converter which is used to extract electrical energy from the pyroelectric capacitors.

A simple version of a switched-mode power convertor is illustrated in FIG. 5. To the left is a standard capacitor 12 initially charged to some high voltage. To the right is another capacitor 13 initially uncharged. If the switch 14 is momentarily closed, then current begins to flow through the inductor 15. After only a very short time (a time less than the resonant time for the capacitor - inductor pair) the switch is reopened. At this moment energy has been passed from the capacitor 12 to the inductor 15. In the next moment energy passes from the inductor to the capacitor 13 as the curent now flows through the diode 16. The net result is that energy in the form of charge on capacitor 12 has been transferred to energy stored on capacitor 13. The transfer may be done very efficiently, i.e. with 95% to 98% efficiency. Note that simply connecting the two capacitors directly together (without an intermediate inductor) would have resulted in a loss of 50% of the transferred energy. The essential aspects of the switched-mode power converter are used in the present invention to efficiently discharge and recharge the pyroelectric capacitors. The details of the external voltage source circuit will be presented after describing the temperature, voltage and power as functions of time of a segment of the disk 2 of FIG. 4.

Figure 6:
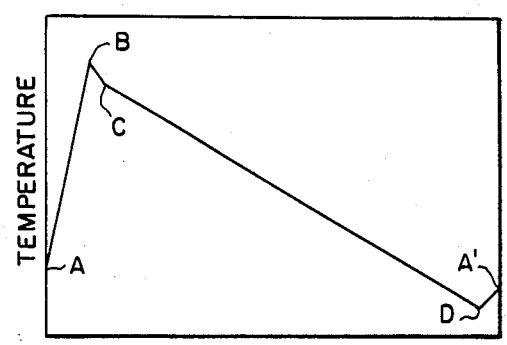
FIG. 6 is a graph of temperature versus time of a pyroelectric capacitor during a typical conversion cycle.

The reference points for an extraction cycle were hereinbefore given in the charge-voltage diagram in FIG. 2. The temperature excursions during a cycle are shown in FIG. 6. The temperature history in FIG. 6 corresponds to that of a segment, for example segment 6, within the disk of a CD structure of FIG. 4. The rapid increase in the temperature between points A and B of FIG. 6 is indicative of the concentrated heat input. Similarly, the much slower temperature decline between points C and D indicates the slower process of reradiation of heat out to, for example, deep space.

Figure 7:
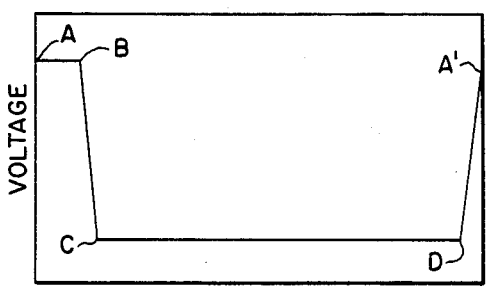
FIG. 7 is a graph of the voltage vs. time of a pyroelectric capacitor during a typical conversion cycle.
Figure 8:
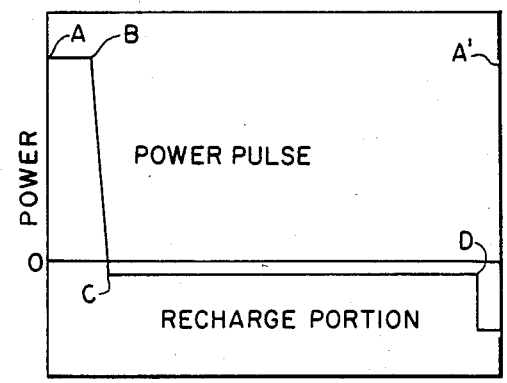
FIG. 8 is a graph of power vs. time of a pyroelectric capacitor during a typical conversion cycle.

The voltage profile and power extraction profile for an individual segment are shown in FIGS. 7 and 8 respectively. The voltage during power extraction will remain approximately constant for the period of time between points A and B as shown in FIG. 7. For a 10 micrometer thick pyroelectric sheet which is stressed to 300 MV/m the extraction voltage would be 3000 V. As power extraction continues, the voltage will drop to some lower point marked by point C. At the same time as this lowest voltage is reached, power becomes available from the next segment for collection. Also, at this point, further power extraction from the first section stops and a recharge cycle begins. The geometry and number of these sections will be arranged so that one segment is always at a high voltage potential and in an extraction mode at the time that another section or sections must be brought up to high voltage by adding charge. Said voltage increasing time is indicated by the line between points D and A', A' being equivalent to the point A, but A' begins the next cycle.

Figure 9:
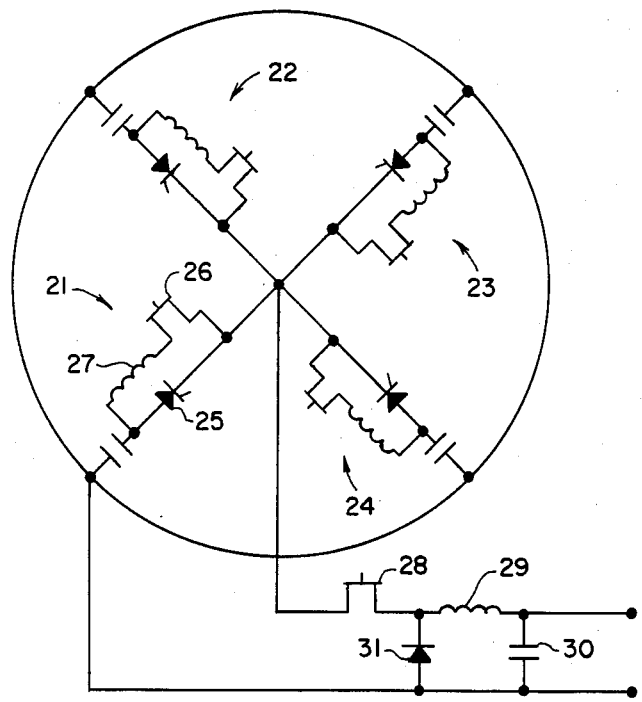
FIG. 9 is a schematic showing the circuitry which can accomplish both power extraction and recharging of the pyroelectric capacitors during a typical conversion cycle.
Figure 10:
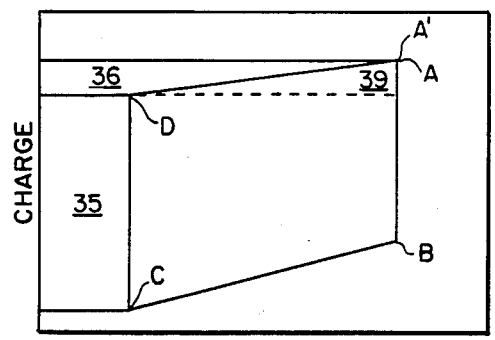
FIG. 10 is a graph of the charge vs. voltage of the pyroelectric capacitor during a typical conversion cycle, the crosshatched areas representing the energy which must be delivered to the pyroelectric capacitor from the external circuitry.

A simplified circuit design which can accomplish both power extraction and pyroelectric generator recharging is shown in FIG. 9. A central bus point 20 is fed from the several individual pyroelectric segments 21,22,23,24. Whenever a particular pyroelectric segment, for example 21, is at high voltage and ready to begin extraction, the SCR switch 25 for this segment is closed thereby transferring this segment's voltage onto the central bus. Because this transferred voltage is higher than that of the previous segment, for example 22, which has become almost depleted, the previous contributor to the bus, segment 22, is back biased thereby going off, i.e. opening that switch, until segment 22 is again gated on by the controlling circuit. This new section then contributes output energy until it is also depleted and replaced by the next in a repetitive cyclical manner. During the balance of the cycle time, i.e. when a segment is not contributing power, the segment is recharged. FIG. 10 illustrates the energy required for the recharge cycle (from point C to A). The recharge is accomplished by a high voltage, high frequency switching regulator as depicted in FIG. 9 by FET 26 (Field Effect Transistor) and inductor 27 (the recharging diodes are not shown). This regulator is "programmed" to recharge each segment utilizing power from the central bus. Energy efficiency during recharging should be high, perhaps 95% to 98%. It is also important to realize that the recharging energy will be only some fraction of the output energy. Therefore the 5% recharging energy loss applies only to a fraction of the output energy. The switching regulator will be programmed in order to profile the recharging voltage as depicted in FIGS. 7.

The extractor power on the central bus must be conditioned in order to remove the high percentage of low frequency ripple. This can be accomplished by using a high frequency switch regulator, shown in FIG. 9, made up of components FET 28, inductor 29, capacitor 30 and diode 31. The output from this power conditioning and regulating circuit will be slightly lower than the lowest voltage on the central bus. Extraction could typically reduce the voltage on a given segment down to, for example, 500 volts resulting in a final user bus voltage of about 400 volts. This output conditioning could be done at 95% to 98% efficiency.

There are three separable types of losses associated with the power extraction-conditioning system. The first is associated with charge up portions of the thermodynamic cycle, the second corresponds to the discharge (extraction) legs of the cycle and the third relates to conditioning the output for consumption by the load. Only the first two losses will be discussed here since the third loss is determined by the requirements of an unspecified load.

In order to estimate the extractor power losses it is necessary first to describe the electrical energy flows into an out of the pyroelectric material. FIG. 10 shows a simplified version of the charge versus voltage plot of the pyroelectric cycle of FIG. 2. The charge up portion of the cycle begins during the lower voltage cool-down between points C and D. During that portion, an external source must transfer electrical energy to the pyroelectric. The area 35 in FIG. 10 is equal to the electrical energy which is delivered to the pyroelectric during the first portion of the charge up. Further charging of the pyroelectric occurs during the cool isothermal voltage ramp-up between points D and A'. Once again an external circuit must supply electrical energy, area 36, to the pyroelectric. The sum of the electrical energies required to charge-up the pyroelectric, area 35 plus area 36, is loosely analogous to the mechanical compression energy which is necessary in steam turbine cycles.

The electrical energy investment used to charge up the system must necessarily be more than repaid during the remainder of the cycle in order for the pyroelectric converter to be a net producer of electrical energy.

Figure 11:
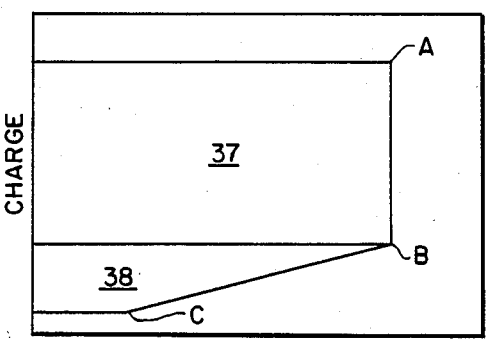
FIG. 11 is a graph of the charge vs. voltage of the pyroelectric capacitor during a typical conversion cycle, the crosshatched areas representing the energy which is delivered to the external circuitry from the pyroelectric capacitor.

Power output of the pyroelectric begins with the high voltage warm-up which occurs between points A' (or equivalently A) and B. The electrical energy extracted from the pyroelectric to the external circuit is indicated by the area 37 in FIG. 11. Additional energy is extracted from the pyroelectric to the external circuit in the hot isothermal voltage reduction from point B to point C and the energy transferred is represented by the area 38 in FIG. 22. The electrical energy output from the pyroelectric during the discharge is equal to areas 37 plus 38. The net electrical output of the cycle is the difference of the discharge energy (area 37 and 38 FIG. 11) minus the charge up energy (area 35 and 36 FIG. 10). The discharge energy exceeds the charge up energy because a portion of the thermal energy which entered the pyroelectric material during the high voltage warm up leg was converted to electrical energy. The net energy of the process is the area enclosed within the lines ABCDA'.

From this detailed description, the following two points may be emphasized. First, the electrical energy flows, into and out from the pyroelectric material, have been explicitly shown. Second, the foundation has been laid to describe the electrical circuit losses associated with the injection and extraction of the electrical energy to and from the pyroelectric. As described earlier, the charge transfer may be accomplished with an efficiency of 95% or greater by utilization of switched-mode power supply techniques. The energy loss then may be approximated as 5% or less of the energy which is circulated into and out of the pyroelectric material during the cycle. If the eventual cycle obtained has the appearance of the cycle in FIG. 2 then the total injection and extraction loss will be about 10% compared with the net output energy.

The need to provide for an efficient means for charging and discharging the pyroelectric capacitor is an important point of the present invention. In the previous detailed description of the charging and discharging of a pyroelectric capacitor the voltage increasing and voltage decreasing portions are of special interest. In the present invention it is suggested that the charging and discharging of the portions BC and DA' be performed with an efficient variable voltage source. If this suggestion is not followed then important degradation of the efficiency of the pyroelectric converter results. For example, if a constant voltage source, at the fixed relatively high voltage value, is used to charge up the capacitor along D to A', then a quantity of electrical energy equal to the area 39 will be dissipated. If a constant voltage source, at the fixed relatively low voltage value, is used to discharge the capacitor along B to C, then a similar quantity of electrical energy will be dissipated. As a result, the net electrical energy produced would be substantially less than in the previously described efficient method.

Figure 12:
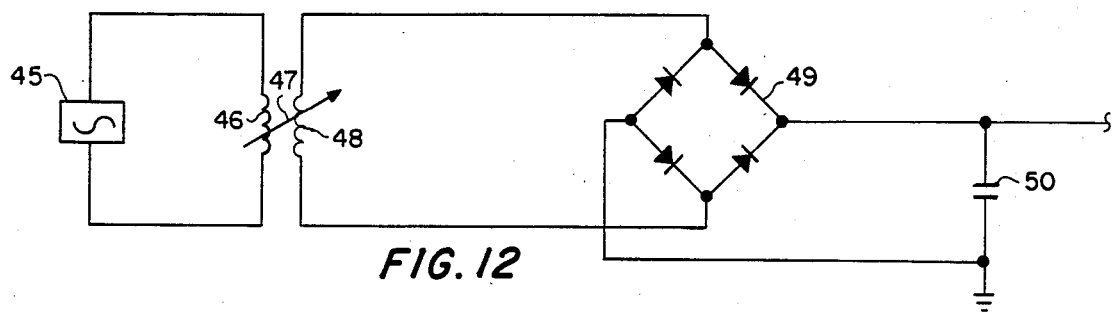
FIG. 12 is a schematic showing another circuit which may serve as an efficient continuously variable voltage source.

Another circuit which may serve as a relatively efficient continuously variable voltage source is the variable transformer circuit illustrated in FIG. 12. Beginning at the left with the fixed value alternating current voltage source 45, current flows through the primary windings 46 of the variable transformer 47. Depending upon the setting of the variable transformer at any given moment, a differnt value of alternating current voltage appears at the secondary 48 of the variable transformer. The output of the secondary is rectified with a full wave bridge rectifier 49 and the resulting direct current is smoothed by the normal capacitor 50. A relatively efficient continuously variable voltage source is thus provided by varying the variable transformer.

Another aspect of the present invention concerns energy storage. Orbiting spacecraft, for example, generally require some sort of energy storage. For a satellite which derives its energy from photovoltaics, the energy is stored in the electrical energy of a charged up battery. In a pyroelectric system energy may also be stored in electric batteries. Alternatively, a pyroelectric system may be coupled to a thermal storage element with the partial or complete elimination of electrical batteries.

The energy density of the thermal storage system may exceed that for batteries. Consider the storage of sensible-heat in lithium. Lithium's heat capacity is 4 Joule/gm K in the range 973 to 1773 K. Over that temperature range, 3200 Joule per gram (3.2 megaJoule per kilogram) of thermal energy may be stored in lithium. If this heat energy is later converted by a 2% efficient pyroelectric device, then the equivalent electrical energy storage is 64 thousand Joule per kilogram (18 W-hr/kg). With an 8% efficient pyroelectric system the equivalent electrical energy density would be 260 thousand Joule per kilogram (70 W-hr/kg). For comparison, the electrical storage energy densities for NiCd and NiH2 batteries are 26 and 40 W-hr/kg (and charging efficiencies of 76% and 65%) respectively.

Thermal energy may also be stored by melting a material. The heats of fusion for several materials are given by Severns and Cobble 16th Intersociety Energy Conversion Engineering Conference, p 89 (1981), for melting transitions in the range of 1600 to 2100 K. High heats of fusion per kilogram are possible, for example silicon's value is 1.8 megaJoule per kilogram, and the potential for isothermal heat transfer is attractive. As for any thermal storage which uses a melting medium, heat transfer through the solid phase may present difficulties. In the previous case of the lithium storage material, the lithium remains liquid during the entire thermal cycle.

Figure 13:
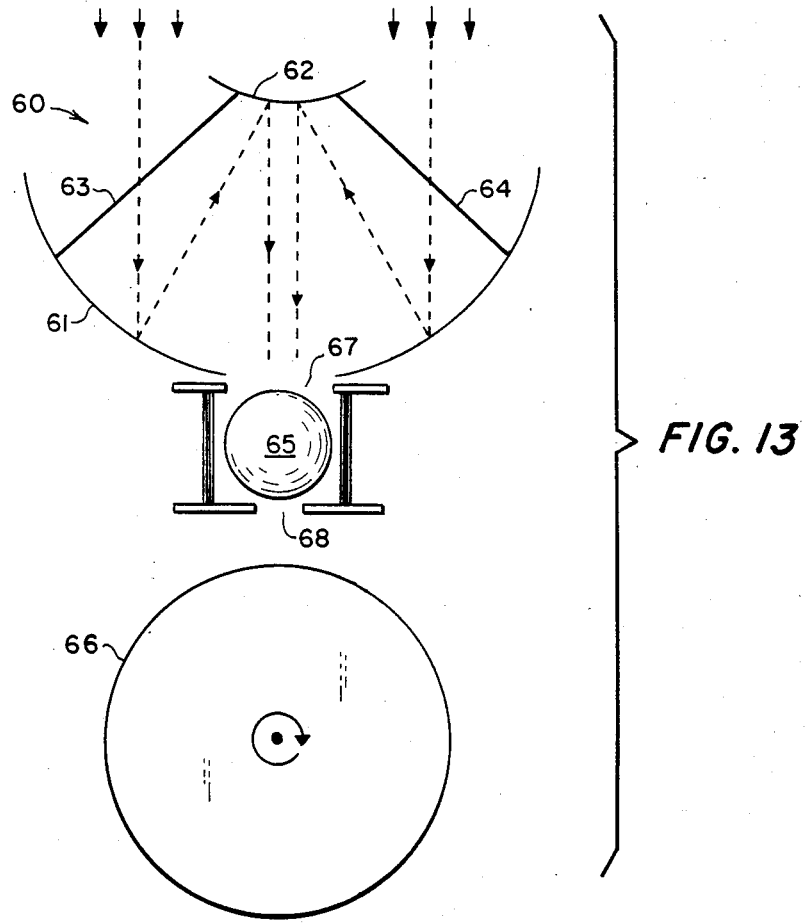
FIG. 13 illustrates a pyroelectric conversion system which includes thermal energy storage.

FIG. 13 schematically illustrates a way in which the thermal storage element may be incorporated into a pyroelectric conversion system. Sunlight enters from the top and is concentrated by a Cassegrainian-like mirror system 60. The thermal storage element 61 sits at the focus of the concentrator. When the spacecraft is in "daylight" the thermal element collects heat while simultaneously delivering heat to the rotating pyroelectric cylinder sheet 62. While the spacecraft is in the sunlight, there is a net gain of heat in the thermal storage element. When the spacecraft passes into the shadow of the earth, aperture 63 is closed to avoid an unnecessary heat loss. The retained heat in the thermal storage element provides continuous radiative heating of the pyroelectric sheet. If the thermal storage medium is of the sensible-heat type (e.g. lithium), then it will be necessary to open the aperture 64 as the medium cools if constant heat transfer from the medium to the pyroelectric sheet is to be maintained. For the lithium case discussed earlier, the area must change by a factor of eleven. For an isothermal latent heat storage medium, the aperture may remain essentially fixed.

It is well known that the requirement of electrical batteries for an orbiting high power spacecraft has an important impact upon the system mass. Such is also the case for the thermal storage subsystem in a pyroelectric power supply. The mass of batteries (either electrical or thermal) is determined by amount of time that the spacecraft spends in the shadow of the earth. At low orbit the percentage of orbital period spent in the shadow is maximal. At higher orbits the percentage of time spent in the shadow decreases but the amount of time remains fairly constant. For example, the shadow time for a 555 km orbit is 0.59 hour while the shadow times at 5090 and 35800 km are 0.64 and 1.2 hour (for equatorial orbits). Using 0.6 hour of storage and the 18 to 70 W-Hr/kg derived earlier for the thermal storage approach, we may see that 8.6 to 33 kilograms of lithium are required per kilowatt. For comparison, it is estimated that the pyroelectric system mass per kilowatt (exclusive of energy storage) will be from 2 to 10 kg. Thus thermal storage may be expected to dominate over other component masses in orbiting systems which require large amounts of power when the spacecraft is in the earth's shadow.

It is noteworthy that a pyroelectric system including thermal storage may have a mass of about 10 kg per kw. Thus the pyroelectric system may be only half as massive per watt of electric power as an advanced orbiting reactor system.

Pyroelectric conversion systems are well suited for coupling to ion propulsion devices. The most straightforward output of a pyroelectric generator is high voltage direct current. The majority of the power required by an ion propulsion system is also high voltage dc. By contrast the standard output of a conventional photovoltaic array is low voltage dc.

In a conventional power processing scheme for ion thrusters several processing steps are involved. Starting with the low voltage dc output of a photovoltaic array, the power must first be converted to alternating current. The second step is to transform the ac to a higher voltage. The third step is to rectify the ac power. Then the rectified power must be filtered. And finally, the power must be modulated to control the amount of power which is delivered to the ion propulsion system. This approach suffers from the serial nature of the efficiencies and reliabilities of all of the steps in the process.

The electrical output of a pyroelectric generator may conveniently come preprocessed and ready for immediate consumption by the ion thruster. Thus a pyroelectric driven ion propulsion system may be constructed which eliminates most of the processing steps just mentioned. The pyroelectric converter described earlier had an output dc voltage of 400 V, but the output voltage may easily be increased to 80% of the extraction voltage (3000 V). The output of the pyroelectric generator may be matched to the high voltage of the ion thrusters's high power consumption components, the screen and accelerator.

An issue which is related to ion propulsion is that of raising the orbit of a spacecraft from low earth orbit (LEO) to higher altitude. The general approach to the delivery of a very large spacecraft to geostationary earth orbit (GEO) is to first place the parts of the craft in LEO, then assemble it in the "absence of gravity". After assembly the large structure may be transported to GEO by some sort of ferry. Photovoltaic arrays have been suggested as a possible power source for the orbit raising system. Unfortunately, the excursion from LEO to GEO is expected to span several days to several weeks. The extended time spent in the radiation belts would severly damage the photovoltaic cells.

Figure 14:
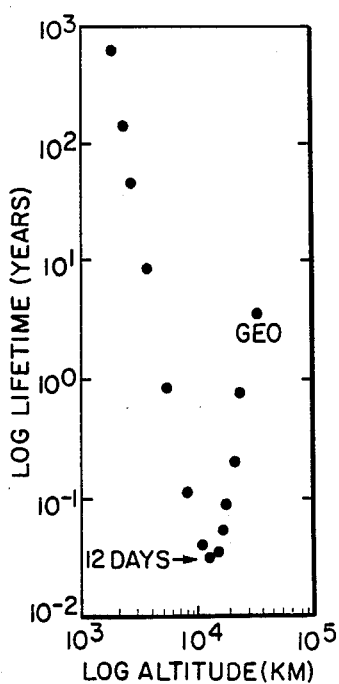
FIG. 14 shows the estimated liftime of an unshielded pyroelectric polymer sheet as a function of altitude.

The pyroelectric converter could be used to power an orbit raising system. FIG. 14 shows the estimated lifetime of an unshielded pyroelectric sheet as a function of altitude. The lifetimes for the pyroelectric sheet are in the range of 1 to 100 years for all but the most severe region of the Van Allen belt. At the peak radiation levels of the belt, the lifetime of the pyroelectric sheet dips to 12 days. By comparison, an unprotected solar cell would have its output power cut in half in about 0.1 day at the same altitude. It is important to note that the sensitivity of PZST to ionizing radiation is so small by comparison with that of the polymer, that for PZST ionizing radiation is a very minor concern.

It appears therefore, that pyroelectric converters may have the survivability to provide the power source for orbit raising system even without employing the methods for protecting the pyroelectric capacitor sheets from ionizing radiation. In addition, the pyroelectric systems can dispose of damaged sheets as necessary in order to extend the system lifetime even further. For example, a new pyroelectric sheet may be erected in place of an old sheet using any necessary support structure which had previously used by the old sheet. Since the mass of the thin pyroelectric sheet is so minor in comparison with other components of the pyroelectric converter system, the use of numerous sheets may be made with an extremely small relative mass penalty.

Figure 15:
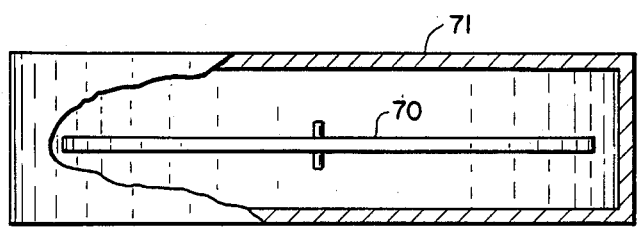
FIG. 15 illustrates a mehtod of shielding the pyroelectric capacitor from exposure to damaging ionizing radiation.

An additional feature which may be incorporated into a pyroelectric converter is a means of protecting the pyroelectric polymer against ionizing radiation. Radiation hardening of the pyroelectric converter may be achieved by at least two design approaches. The first method, shown in FIG. 15, is to surround the pyroelectric disk 70 (in the CD design) with a shield 71 against ionizing radiation shown in FIG. 15. A pancake shaped "can," for example, made of aluminum sheet 76 micrometer (0.003 inch) thick would decrease the ionizing radiation flux substantially. Under the worst case orbit conditions at the altitude which corresponds to the peak radiation levels of the Van Allen belts, the lifetime for the pyroelectric converter would be increased from 12 days to 1.5 years by the addition of such a shield. The lifetime is assumed to be the equal to or greater than the time required for the pyroelectric sheet material to absorb a 100 megarad dosage according to the study of T. T. Wang, Ferroelectrics, 41, p. 213, (1982). Greater lifetime enhancements would be possible if thicker walled shielding were utilized.

Another method for hardening the pyroelectric converter to the effects of ionizing radiation would be to encapsulate the pyroelectric sheet. In this approach the shield is in direct physical contact with the pyroelectric sheet. The most straight forward application of this idea (say placing the aluminum sheets of the previous method in contact with a 10 micrometer thick pyroelectric polymer) would result in a drastic reduction of the efficiency of the converter. The reason this is so is that the added heat capacity of the shield will demand a much greater input of thermal energy than is required to thermally cycle the polymer sheet alone (the reduction in efficiency would be about a factor of 9). If, however, the number of pyroelectric sheets is increased so that the heat capacity of the pyroelectrics dominates over that of the shield, then the efficiency will be little effected.

For space missions in which high voltages (on the order of 10,000 volts) must be supplied by a pyroelectric converter at low orbit, the electrical power losses due to conduction in the surrounding plasma are expected to be large. Several method may be employed to reduce the plasma losses. One method to prevent electrical power loss to the plasma is to totally insulate the pyroelectric converter from the plasma. This may be accomplished by encapsulating the converter in a container or by placing an envelope of insulating material completely around the converter. The approach of using a container necessarily adds mass to the space power system. Fully insulated arrays would avoid all plasma losses if pinhole current leaks could be precluded. Another method to prevent plasma losses is to provide so-called "plasma collectors" near the surface of the pyroelectric capacitors. The potential of these collectors is reduced, relative to the potential of the pyroelectric capacitors, thus current collection occurs at reduced power loss. The plasma collector may be in the form of an open mesh screen. Yet another method to reduce the plasma leakage losses is to surround the pyroelectric capacitors with a biased screen. If, in conjunction with a positively biased module of pyroelectric capacitors, the screen is biased negatively with respect to space potential, then most of the plasma electrons are reflected before they can slip through the screen meshes. Finally, the electrodes of the pyroelectric capacitors may, themselves, be placed at negative potentials though one side of the capacitor will be set to a much greater negative voltage due to the voltage drop across the capacitor) so as to repel incident electrons. If the last approach is used a slow accumulation of positive charge, at a relatively low power loss level, will result. In order to offset the slow positive charge buildup, a means to reject positive charges, for example positive ion thrusters, must be included.

Figure 3:
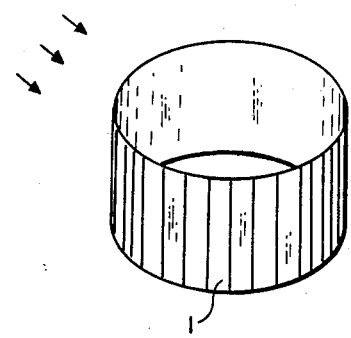
FIG. 3 is a perspective view of a simple cylinder form of an extended structure pyroelectric converter and is representative of the prior art.
Figure 16:
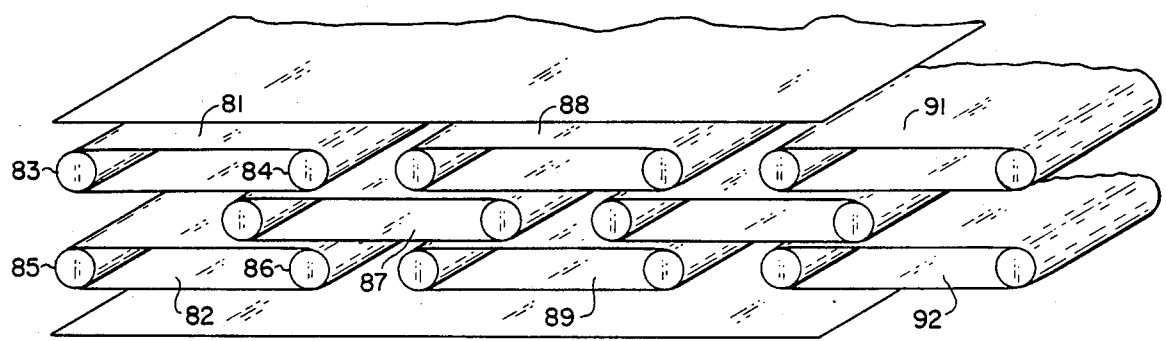
FIG. 16 illustrates a method for achieving regenerative heat flow in an extended pyroelectric converter.

Another object of the present invention is to provide a novel means for regenerative heat flow within the pyroelectric capacitor elements. It is possible to achieve high heat to electrical conversion efficiency with an extended structure pyroelectric converter. Whereas the structures described earlier, FIGS. 3 and 4, were simple designs for functional pyroelectric conversion, somewhat more complex designs yield higher efficiency. The conversion approach which is represented by the structures of FIGS. 3 and 4 share the common attribute that heat enters the pyroelectric material of the device on time, at a relatively high temperature, and later a smaller quantity of heat exits the material at a relatively lower temperature. Heat is passed into and out of the pyroelectric material only one time. An improvement in the conversion efficiency results if the heat is properly cycled into and out of several pyroelectric materials. The idea of recycling the heat, at successively lower temperatures, is conceptually similar to the regeneration described by Olsen in U.S. Pat. No. 4,425,540 for a compact pyroelectric converter. For lightweight extended structure converters, however, a novel heat flow technique must be used. One method of achieving regenerative heat flow in an extended structure is illustrated in FIG. 16. At the core of the converter are belts formed of pyroelectric capacitor sheets. Heat, from a thermal energy source to the left of the device, enters the device at the left edge and is absorbed by belts 81 and 82. Belts 81 and 82 which ride on rotating cylindrical pulleys 83 and 84, and 85 and 86, respectively, transport the heat to the right where it is transmitted to and absorbed by belt 87 at a somewhat lower temperature. Belt 87 in turn passes the heat on to the right to belts 88 and 89 at yet lower temperature. This process of heat transport and transmission from belt to belt continues through to the right with some quantity of heat reaching belts 91 and 92 which thereafter transmit, by radiation or other heat transfer means, heat out to the right of the device. The reason that the recycling of heat leads to increased efficiency is that for each cycling of heat into and out of the pyroelectric material a quantity of electrical energy may be generated. If the number of times that the heat is properly cycled into and out of the pyroelectrical material is increased the the amount of electrical energy which is produced per unit of input heat is also increased. Since efficiency is the ratio of electrical output energy divided by input heat energy such increases lead to improved efficiency.

The increase in efficiency may be further understood by noticing that the approach of FIG. 16 allows for the use of a number of different pyroelectrical materials for the different belts. Since pyroelectrical materials are most effective for the conversion of heat into electrical energy over limited temperature spans, generally of width 20 C. to 50 C., the use of a series of materials, with successively lower temperature operating characteristics, in the different belts of FIG. 16 provides a means of more fully utilizing the heat as it is passed through the successively lower temperatures. Thus the multiple heat cycle usage approach illustrated by FIG. 16 has an efficiency advantage over the single heat cycle approach represented by FIGS. 3 and 4.

An other means to provide for regenerative heat flow and simultaneously providing for the staging of a number of pyroelectric capacitors is illustrated in FIG. 17. The capacitors are formed into disk shaped modules which overlap. The disks are all set in continuous rotation and the regions of overlap provide for transfer of heat by means of thermal radiation. The overlap regions may additionally be filled with fluid, for example gaseous helium or SF6, so as to provide for enhanced heat transport by conduction and convection processes. In a manner similar to that previously described for the regenerative belts, heat would enter the left most portion of disk 95. Due to the rotation of disk 95 heat would be transported to the right and into the overlap region shared between disk 95 and disk 96. Rotation of disk 96 would in turn transfer heat further to the right and into the overlap region shared by disk 96 and disk 97. Heat would be transfer from disk 96 to disk 97 and the rotation of disk 97 would transfer heat further to the right, where by radiation or other heat transfer means, the heat transmitted out to the right of the device.

An important issue for the pyroelectric sheet of the present invention is how does it respond when a small region of the pyroelectric sheet fails electrically. This is a crucial question since several square meters of sheet will be electrically in parallel within a given segment, and if one region fails as a short circuit then the entire segment may be self shunted. Such localized failure will certainly occur as dielectric breakdown of the plastic may be caused by small voids (from the manufacturing process), pinholes, micrometeoroid punctures, or ionizing radiation damage.

The solution of this potential problem is the incorporation of a technique which assures that point electrical failures result in open circuiting rather than short circuiting. One method which solves the problem is to use thin self healing metallic electrodes, for example vapor deposited electrodes, on the surfaces of the pyroelectric material. When a polymer sheet with thin electrodes (500 to 1000 Angstrom thick) suffers a localized dielectric failure the current which pours through the "short" vaporizes the electrode in that region thus electrically disconnecting the failed dielectric region from the remainder of the pyroelectric capacitor sheet.

It is possible that the self-healing approach may be satisfactory for small areas (a few square centimeters) only. If this turns out to be the case, then it may be necessary to incorporate some pattern of subdivision with the electroding of each segment. The subdivided electrode patches might be connected by narrow strips of conductor. The entire pattern would be applied in a single plating process with a grid-like mask defining the boundaries between patches.

The electrodes should be black. The primary purpose for this is to maximize the radiative heat transfer rates. A secondary benefit of this surface preparation is that is minimizes the optical radiation which might otherwise reach the pyroelectric capacitor material and potentially cause damage.

Two possible methods of blackening the electrodes are (1) anodization, and (2) coating with carbon. Presently, the second method is preferred since it results in a conducting outer surface which is helpful in minimizing arcing. Other coatings are also possible and are described by N. J. Broadway in Radiation Effects Design Handbook Section 2. Thermal control Coatings NASA CR-1786, (1971).

While the presently preferred embodiment of the invention has been illustrated and described, various changes, equivalents and alternatives may be resorted to without departing from the spirit of the invention, and all of such changes, equivalents and alternatives are contemplated as may come within the scope of the appended claims and equivalents thereof.

What is claimed as the invention is:

1. A pyroelectric energy converter comprising a capacitor formed of dielectric material having temperature dependent capacitance, means to subject said capacitor to a source of heat to vary thermal energy of said capacitor, a means coupled to said capacitor to substantially reversibly apply charge thereto and to remove charge therefrom, wherein said means to substantially reversibly apply charge to and remove charge from said capacitor comprises a continuously variable voltage source.

2. The converter of claim 1 which additionally comprises a utilization circuit, and an electrical connection between said utilization circuit and said source for diverting a portion of discharged electrical energy to said continuously variable voltage source.

3. A pyroelectric energy converter comprising a capacitor formed of dielectric material having temperature dependent capacitance, means to subject said capacitor to a source of heat to vary thermal energy of said capacitor, a means coupled to said capacitor to substantially reversibly apply charge thereto and to remove charge therefrom, wherein said means to substantially reversibly apply charge to and remove charge from said capacitor comprises an alternating current voltage source, a variable transformer, and a rectifier.

4. A pyroelectric energy converter comprising a plurality of modules of capacitors formed of dielectric material having temperature dependent capacitance and a means coupled to said capacitors to substantially reversibly apply charge thereto and to remove charge therefrom, said modules respectively in serial heat transfer relation to each other, means to subject a given first module of capacitors of said modules to a source of heat to vary thermal energy of said first module, means to transfer heat from said first module to a given second module, means to permit subsequent similar transfers of heat to subsequent other given modules.

5. The pyroelectric energy converter according to claim 1 wherein said dielectric material is a polymer.

6. The pyroelectric energy converter according to claim 1, wherein said dielectric material comprises poly(vinylidene fluoride-trifluoroethylene).

7. The converter of claim 1 wherein the capacitor forms part of a unitary module comprising a plurality of such capacitors, said module is formed into a disk shape, means being provided for continuous rotation of said disk, and said means to subject said capacitors to a source of heat to vary the thermal energy comprises a concentrator of radiant energy.

8. The converter of claim 1 wherein a means to reduce ionizing radiation incident upon said capacitor is provided.

9. The converter of claim 1 wherein a means is provided to reduce electrical energy loss to environment of said capacitor by said capacitor.

10. The converter of claim 9 wherein said means to reduce said electrical energy loss comprises a plasma collector, potential of said plasma collector being reduced relative to potential of the pyroelectric capacitors.

11. The converter of claim 9 wherein said means to reduce said electrical energy loss comprises a biased screen surrounding said capacitor, said capacitor being positively biased with respect to said environment, said biased screen being negatively biased with respect to said environment.

12. The converter of claim 9 wherein said means to reduce said electrical energy loss comprises a second means to bias said capacitor negatively with respect to said environment and a third means to offset accumulation of positive charge.

13. The converter of claim 1 wherein means is provided to reduce thermal energy loss to environment of said capacitor by the capacitor.

14. The converter of claim 1 wherein means is provided to reduce material debris incident upon said capacitor.

15. The converter of claim 8 wherein said means to reduce ionizing radiation comprises a material layer covering which substantially encloses said capacitor.

16. The converter of claim 8 wherein said means to reduce ionizing radiation comprises a container which substantially encloses said capacitor.

17. The converter of claim 9 wherein said means to reduce electrical energy loss comprises a container which substantially encloses said capacitor.

18. The converter of claim 16 wherein said container is substantially filled with a heat transfer fluid.

19. The converter of claim 1 wherein opposing surfaces of said dielectric material are covered with self-healing conducting layers, the layers being about 500 to 1000 Angstroms thick.

20. The converter of claim 1 wherein said voltage source comprises substantially a switched-mode power converter.

21. A pyroelectric energy converter comprising a plurality of capacitors formed of dielectric material having temperature dependent capacitance, said capacitors respectively in serial heat transfer relation to each other, means to subject a given first capacitor of said capacitors to a source of heat to vary the thermal energy of said first capacitor, means to transfer heat from said first capacitor to a given second capacitor, means to permit subsequent similar transfers of heat to subsequent other given capacitors, and means coupled to said capacitors to substantially reversibly apply charge thereto and to remove charge therefrom.

22. The pyroelectric energy converter of claim 21 wherein said means to subject a given first capacitor to a source of heat comprises a collector of radiant thermal energy.

23. The pyroelectric energy converter of claim 21 wherein said means to transfer heat from said first capacitor to a given second capacitor comprises radiant transfer of heat.

24. The pyroelectric energy converter of claim 21 wherein said means to transfer heat from said first capacitor to a given second capacitor comprises a heat transfer fluid, said heat transfer being accomplished by conduction, convection and radiation.

25. A pyroelectric energy converter comprising a plurality of modules of capacitors formed of dielectric material having temperature dependent capacitance, said modules respectively in serial heat transfer relation to each other, means to subject a given first module of capacitors of said modules to a source of heat to vary thermal energy of said first module, means to transfer heat from said first module to a given second module, means to permit subsequent similar transfers of heat to subsequent other given modules, and means coupled to said capacitors to apply charge thereto and to remove charge therefrom.

26. The pyroelectric energy converter of claim 25 wherein said modules comprise a plurality of capacitors formed in a continuous band, said band supported from its interior by cylindrical pulleys.

27. The pyroelectric energy converter of claim 25 wherein said modules comprise a plurality of capacitors forming a disk.

28. The pyroelectric energy converter of claim 25 which additionally comprises a means coupled to said capacitors to substantially reversibly apply charge thereto and to remove charge therefrom.

29. A pyroelectric energy converter comprising a plurality of capacitors formed of dielectric material having temperature dependent capacitance, said capacitors respectively in serial heat transfer relation to each other, means to subject a given first capacitor of said capacitors to a source of heat to vary the thermal energy of said first capacitor, means to transfer heat from said first capacitor to a given second capacitor, means to permit subsequent similar transfers of heat to subsequent other given capacitors, a means coupled to said capacitors to apply charge thereto at a given voltage, and utilization means to remove said charge at a voltage which is increased over said given voltage.

30. A pyroelectric conversion system comprising a thermal storage element and a pyroelectric energy converter, said pyroelectric energy converter comprising a capacitor formed of dielectric material having temperature dependent capacitance, means to subject said capacitor to said thermal storage element to vary the thermal energy of said capacitor, and a continuously variable voltage source coupled to said capacitor to apply charge thereto at a given voltage, and utilization means to remove said charge at a voltage which is increased over said given voltage.

31. The pyroelectric energy converter of claim 30 wherein said thermal storage element comprises a sensible-heat storage medium.

32. The pyroelectric energy converter of claim 30 wherein said thermal storage element comprises a latent heat storage medium within a containment vessel.

33. The method of pyroelectric energy conversion comprising the steps of charging from a continuously variable voltage source a capacitor having temperature dependent capacitance; heating the capacitor; discharging the capacitor into an external circuit; and during such discharge, diverting a portion of the discharged electrical energy to said reversible voltage source.

34. The method of claim 33 wherein said capacitor is thermally cycled, said reversible voltage source is at relatively low voltage while said charging takes place while said capacitor is being cooled from an elevated temperature, and said reversible voltage source is at relatively high voltage while said discharging takes place while said capacitor is being heated.

35. The method of pyroelectric energy conversion comprising the steps of heating a substantially fully charged capacitor having temperature dependent capacitance from a relatively low temperature to a relatively high temperature; during such heating, partially discharging the capacitor into an external circuit at a relatively high voltage; while at said relatively high temperature, substantially discharging the capacitor into a continuously variable voltage source, the voltage of said source initially being equal to said hgh voltage, subsequently decreasing the voltage of said source to a relatively low voltage; cooling the capacitor from said relatively high temperature to said relatively low temperature and during such cooling partially recharging the capacitor from said continuously variable voltage source at said relatively low voltage; and while at said relatively low temperature, substantially fully recharging the capacitor from said continuously variable voltage, the voltage of said source initially being equal to said low voltage, subsequently increasing the voltage of said source to said relatively high voltage.

36. The method of pyroelectric energy conversion which comprises cyclical repetition of the steps of claim 35.

37. The method of energy conversion of claim 35 wherein said low voltage is approximately equal to the lowest voltage at which substantial repoling of the dielectric material of said capacitor is feasible; said high voltage is approximately 90% of the dielectric breakdown voltage of said material at said high temperature.

38. The method of energy conversion of claim 35 wherein said capacitor is ferroelectric and said low temperature is approximately equal to the Curie temperature of the ferroelectric.

* * * * *